US009413105B2

(12) United States Patent
Wang et al.

(10) Patent No.: US 9,413,105 B2
(45) Date of Patent: Aug. 9, 2016

(54) CARRIER FOR FLEXIBLE PRINTED CIRCUIT

(71) Applicant: HON HAI PRECISION INDUSTRY CO., LTD., New Taipei (TW)

(72) Inventors: Yi-Hua Wang, New Taipei (TW); Pen-Uei Lu, New Taipei (TW); Chin-Yu Hsu, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 59 days.

(21) Appl. No.: 14/481,689

(22) Filed: Sep. 9, 2014

(65) Prior Publication Data

US 2016/0072225 A1 Mar. 10, 2016

(51) Int. Cl.

| | |
|---|---|
| ***H01R 12/00*** | (2006.01) |
| ***H05K 1/00*** | (2006.01) |
| ***H01R 13/627*** | (2006.01) |
| ***H01R 12/62*** | (2011.01) |
| ***H01R 13/648*** | (2006.01) |

(52) U.S. Cl.

CPC ............ *H01R 13/6275* (2013.01); *H01R 12/62* (2013.01); *H01R 13/648* (2013.01)

(58) Field of Classification Search

CPC .. H01R 13/6275; H01R 12/62; H01R 13/648; H01R 13/627

USPC .............................. 439/67, 596, 328, 77, 345

See application file for complete search history.

(56) References Cited

U.S. PATENT DOCUMENTS 5,181,854 A * 1/1993 Masuda ............. H01R 12/7082 439/493

7,094,067 B2 * 8/2006 Kitagawa ............... H01R 12/62 439/493

FOREIGN PATENT DOCUMENTS

JP 11-242971 A 9/1999

* cited by examiner

*Primary Examiner* — Javaid Nasri

(74) *Attorney, Agent, or Firm* — ScienBiziP, P.C.

(57) ABSTRACT

A carrier for a flexible printed circuit (FPC) includes a number of latching members. The latching members secure the carrier to a printed circuit board (PCB).

16 Claims, 3 Drawing Sheets

CARRIER FOR FLEXIBLE PRINTED CIRCUIT

FIELD

The present disclosure generally relates to flexible printed circuits (FPCs), and more particularly to a carrier to connect an FPC to a printed circuit board (PCB).

BACKGROUND

Flexible printed circuits (FPCs) are used in a variety of electronic devices. The FPCs can be connected to printed circuit boards (PCBs) of the electronic devices.

BRIEF DESCRIPTION OF THE DRAWINGS

Implementations of the present technology will now be described, by way of example only, with reference to the attached figures.

DETAILED DESCRIPTION

Figure 1:
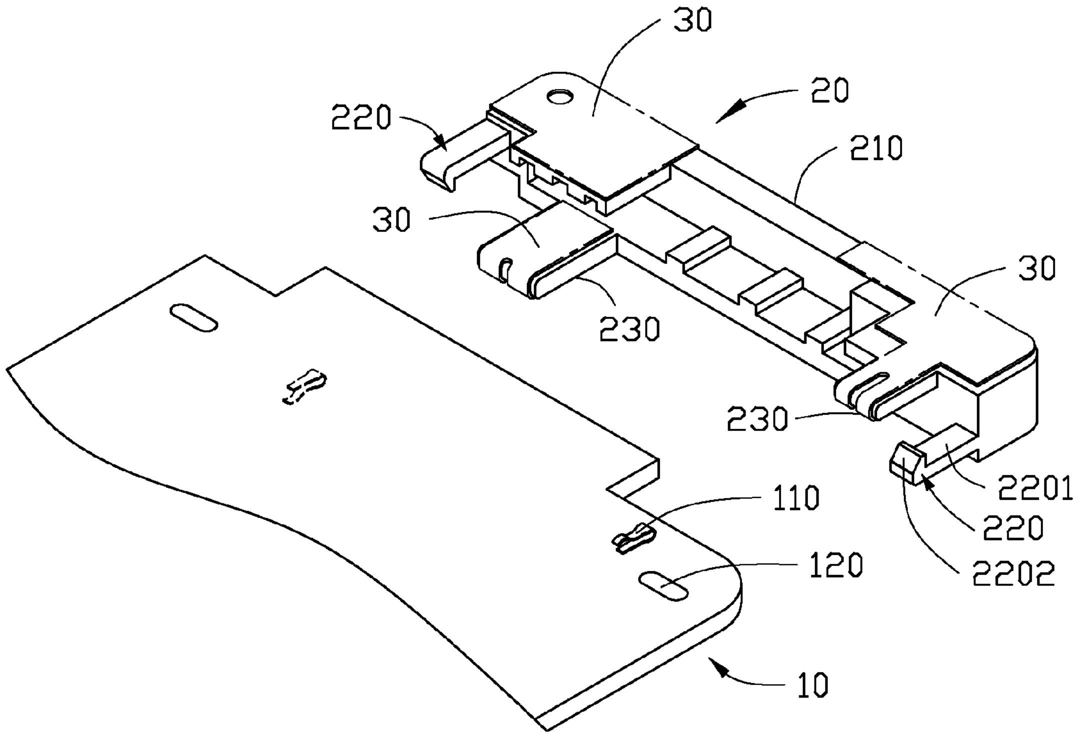
FIG. 1 is an exploded view of an exemplary embodiment of a carrier and a printed circuit board (PCB).

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein, However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Definitions that apply throughout the disclosure will now be presented.

The references “a plurality of” and “a number of” mean “at least two.” The term “comprising,” when utilized, means “including, but not necessarily limited to”; it specifically indicates open-ended inclusion or membership in the so-described combination, group, series, and the like.

FIG. 1 illustrates an example embodiment of a carrier 20 for a flexible printed circuit (FPC) 30. The FPC 30 can be located on the carrier 20. The carrier 20 can be secured to a printed circuit board (PCB) 10 to electrically connect the FPC 30 to the PCB 10. In at least one embodiment, the carrier 20 is not made of metal to prevent signal interference between the carrier 20 and electronic components, such as an antenna. In at least one embodiment, the carrier 20 is made of plastic.

The carrier 20 can include a main body 210 and a plurality of contacting members 230. In at least one embodiment, there are two contacting members 230 extending from the main body 210. A first contacting member 230 can extend from an upper portion of the main body 210, and a second contacting member 230 can extend from a lower portion of the main body 210. A portion of the FPC 30 can be located on a bottom surface of the first contacting member 230, and another portion of the FPC 30 can be located on a top surface of the second contacting member 230.

A plurality of resilient latching members 220 can extend from the main body 210 of the carrier 20. In at least one embodiment, there are two latching members 220. A first latching member 220 can extend from the upper portion of the main body 210, and a second latching member 220 can extend from the lower portion of the main body 210. Each latching member 220 can include a latching portion 2201 and a hooked portion 2202. The latching portion 2201 can extend from the main body 210, and the hooked portion 2202 can extend from the latching portion 2201. In at least one embodiment, a distance between the two latching portions 2201 is substantially equal to a thickness of the PCB 10. In at least one embodiment, the first contacting member 230 and the second latching member 220 can be located adjacent to one side of the main body 210, and the second contacting member 230 and the first latching member 220 can be located adjacent to another side of the main body 210.

The PCB 10 can include a plurality of elastic pieces 110 corresponding to the plurality of contacting members 230. In at least one embodiment, there are two elastic pieces 110. A first elastic piece 110 is located on a top surface of the PCB 10, and a second elastic piece 110 is located on a bottom surface of the PCB 10.

The PCB 10 can define a plurality of holes 120 corresponding to the plurality of latching members 220. In at least one embodiment, the PCB 10 defines two holes 120, and each hole 120 is a through hole.

Figure 2:
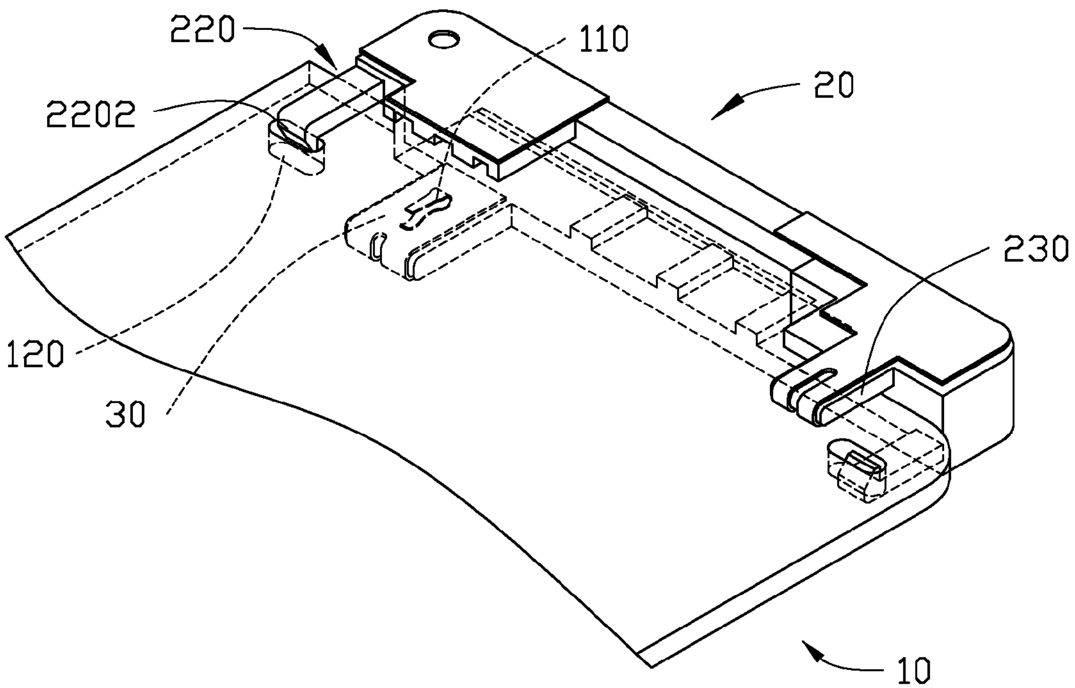
FIG. 2 is an assembled view of the carrier and the PCB.

FIG. 2 illustrates assembly of the carrier 20 to the PCB 10. The latching members 220 can be deformed to allow the hooked portions 2202 to insert through the corresponding holes 120 of the PCB 10. After the hooked portions 2202 insert through the corresponding holes 120, the latching members 220 can restore to latch a corresponding portion of the PCB 10 between the two latching portions 2201. Thus, the carrier 20 can be firmly secured to the PCB 10.

When the carrier 20 is secured to the PCB 10, the first elastic piece 110 contacts the portion of the FPC 30 located on the bottom surface of the first contacting member 230, and the second elastic piece 110 contacts the portion of the FPC 30 located on the top portion of the second contacting member 230. The elastic pieces 110 can electrically connect the FPC 30 to the PCB 10. Furthermore, the carrier 20 is firmly secured to the PCB 10 such that the carrier 20 is prevented from moving relative to the PCB 10.

Figure 3:
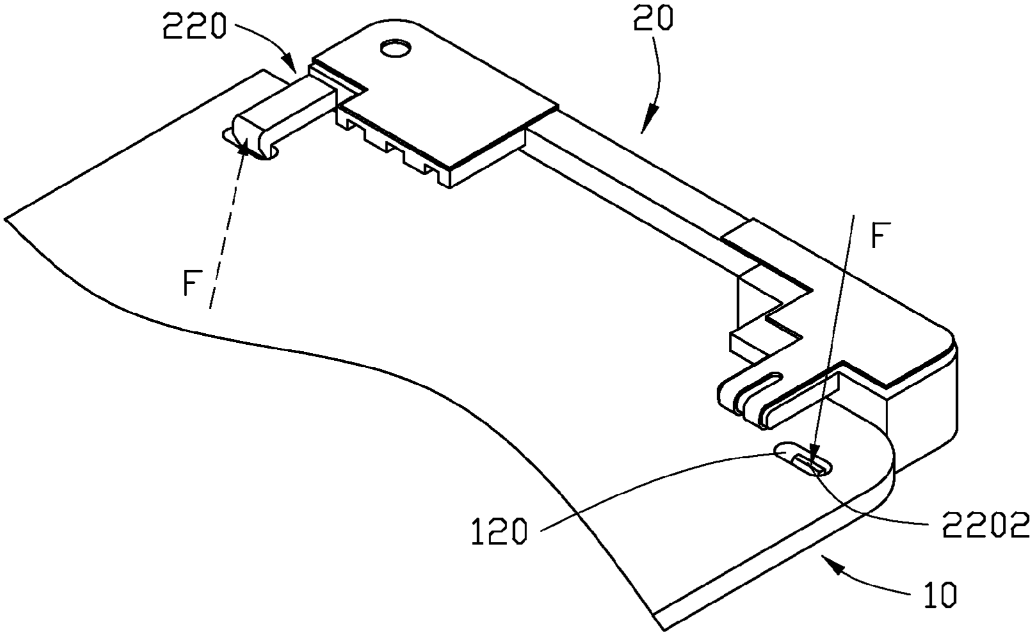
FIG. 3 is similar to FIG. 2, but shows a disassembly process of the carrier from the PCB.

Referring to FIG. 3, to remove the carrier 20 from the PCB 10, the latching members 220 are deformed to remove the hooked portions 2202 from the corresponding holes 120. Thus, disassembly of the carrier 20 from the PCB 10 is convenient.

In another embodiment, the holes 120 can be blind holes, such that a first hole 120 is defined in the top surface of the PCB 10, and a second hole 120 is defined in the bottom surface of the PCB 10. The hooked portion of the first latching member 220 can insert into the first hole 120, and the hooked portion of the second latching member 220 can insert into the second hole 120.

In the present disclosure, the carrier 20 can be secured to the PCB 10 easily by the latching members 220. Thus, additional securing components, such as screws, are not needed. Because the carrier 20 is not made of metal and does not require other metal components to be secured to the PCB 10, signal interference between the carrier 20 and electronic components, such as an antenna, is prevented.

The embodiments shown and described above are only examples. Many details are often found in the art. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A carrier for a flexible printed circuit (FPC) comprising a plurality of latching members, wherein the plurality of latching members secure the carrier to a printed circuit board (PCB), each latching member is latched to the PCB through a corresponding hole defined in the PCB, the FPC is located on surfaces of the carrier, the carrier further comprises a main body and a plurality of contacting members extending from the main body; the FPC is located on surfaces of the main body and of the contacting portions, two contacting members extends from the main body, a first contacting member extends from an upper portion of the main body, and a second contacting member extends from a lower portion of the main body.

2. The carrier as described in claim 1, wherein the latching members are connected to the main body of the carrier.

3. The carrier as described in claim 2, wherein there are two latching members, a first latching member connected to the upper portion of the main body, and a second latching member connected to the lower portion of the main body.

4. The carrier as described in claim 3, wherein the first contacting member and the second latching member are located adjacent to one side of the main body, and the second contacting member and the first latching member are located adjacent to another side of the main body.

5. The carrier as described in claim 4, wherein the two latching members are resilient; each latching member comprises a latching portion and a hooked portion; a distance between the two latching portions is substantially equal to a thickness of the PCB; the latching portions are deformed to insert the hooked portions into the corresponding holes of the PCB, thereby securing the carrier to the PCB; a corresponding portion of the PCB is latched between the latching portions of the latching members when the latching members restore after the hooked portions insert into the corresponding holes.

6. The carrier as described in claim 5, wherein when the carrier is secured to the PCB, the first contacting member contacts a first resilient piece, and the second contacting member contacts a second resilient piece; the first resilient piece is located on a top surface of the PCB, and the second resilient piece is located on a bottom surface of the PCB.

7. The carrier as described in claim 6, wherein a portion of the FPC is located on a bottom surface of the first contacting portion, and another portion of the FPC is located on a top surface of the second contacting portion; the first resilient piece contacts the portion of the FPC located on the bottom surface of the first contacting portion, and the second resilient piece contacts the portion of the FPC located on the top surface of the second contacting portion.

8. The carrier as described in claim 7, wherein the first resilient piece and the second resilient piece electrically connect the PCB to the FPC.

9. The carrier as described in claim 8, wherein when the carrier is secured to the PCB, the carrier is prevented from moving relative to the PCB.

10. The carrier as described in claim 9, wherein to release the carrier from the PCB, the latching members are deformed to remove the hooked portions from the corresponding holes.

11. The carrier as described in claim 10, wherein the carrier is not made of metal.

12. The carrier as described in claim 10, wherein the carrier is made of plastic.

13. The carrier as described in claim 10, wherein the holes of the PCB are through holes.

14. The carrier as described in claim 13, wherein the hooked portions of the latching members can extend all the way through the corresponding through holes.

15. The carrier as described in claim 10, wherein the holes of the PCB are blind holes.

16. The carrier as described in claim 15, wherein a first hole corresponding to the first latching member is defined in the top surface of the PCB, and a second hole corresponding to the second latching member is defined in the bottom surface of the PCB.

* * * * *